United States Patent [19]

Ashley et al.

[11] 4,002,970
[45] Jan. 11, 1977

[54] OPTIMUM THRESHOLD TRANSMISSION LINE DISCRIMINATOR

[75] Inventors: James R. Ashley, Colorado Springs, Colo.; Gustaf J. Rast, Jr.; Thomas A Barley, both of Huntsville, Ala.

[73] Assignee: The United States of America as represented by the Secretary of the Army, Washington, D.C.

[22] Filed: Jan. 26, 1976

[21] Appl. No.: 652,593

[52] U.S. Cl. .............................................. 324/57 N
[51] Int. Cl.² ........................................ G01R 27/00
[58] Field of Search ........................ 324/57 N, 57 R; 328/166, 165; 325/67, 363; 178/DIG. 12

[56] References Cited

UNITED STATES PATENTS

| | | | |
|---|---|---|---|
| 3,675,124 | 7/1972 | Ashley et al. | 324/57 N |
| 3,693,076 | 9/1972 | Nugent et al. | 324/57 N |

*Primary Examiner*—Stanley T. Krawczewicz
*Attorney, Agent, or Firm*—Nathan Edelberg; Robert P. Gibson; Freddie M. Bush

[57] ABSTRACT

An optimum length transmission line discriminator circuit is disclosed which provides for measurement of near carrier frequency modulation in the microwave region. An optimum length of transmission line within the discriminator is instrumental in providing the discrimination function. The transmission line discriminator possesses the same basic circuit properties required to provide measurement and affords a broader range of operation than established microwave cavity methods can feasibly provide. The optimized transmission line length provides for maximum efficiency from the transmission line parameters over a wide frequency range. In measuring frequency modulation noise, carrier nulling in excess of 60 decibels is accomplished with a slide screw tuner in conjunction with the optimized length line. This null is relatively insensitive to environmental effects. After this carrier null has been accomplished, the discriminator circuit rejects incidental amplitude modulation on the test signal, and is not restricted by burnout power ratings of crystals within the phase detector.

10 Claims, 3 Drawing Figures

OPTIMUM THRESHOLD TRANSMISSION LINE DISCRIMINATOR

DEDICATORY CLAUSE

The invention described herein may be manufactured, used, and licensed by or for the Government for governmental purposes without the payment to us of any royalties thereon.

BACKGROUND OF THE INVENTION

In the established art of measuring selected radio frequency (RF) signals a broad spectrum of techniques and measurement apparatus is available. In constantly striving to improve system components, reduction in self-generated noise, and rejection or suppression of transient or other inherent noises are problems which are always involved. To reduce noise, such as that inherent in an oscillator or amplifier so that low level intelligent signals can be measured, the noise level and characteristics must be identified. Thus in apparatus for providing measurement of noise in the frequency domain, the noise becomes the signal of interest.

The use of a frequency discriminator to measure near carrier frequency modulation noise of a microwave signal was described by Ashley et al in the IEEE Transactions on Microwave Theory and Techniques, Volumn MTT-16, No. 9, September 1968, pages 753–760. Prior art discrimination at microwave frequencies, as described in this paper depended on a microwave cavity as a resonant circuit. Prior art discrimination at very high frequencies (VHF) utilize such components as slope detectors and ratio detectors, depending on the lumped circuit elements of inductance and capacitance, to form resonant circuits. At ultra high frequencies (UHF) between the VHF and microwave regions, there is little prior art on such discrimination means. Most measurements in this area are made by beating or heterodyning the UHF signal with a local oscillator to obtain a VHF signal which is analyzed with a discriminator at the VHF frequency range. Accounting for the FM noise of the local oscillator is a well established problem in these areas. Both of these techniques provide a means for rejecting residual amplitude modulation (AM) noise on the signal under test; for example, the VHF discriminators usually employ a limiter or ratio detector. The microwave cavity discriminator rejects AM noise, allows the input signal level to be increased, and provides the greatest discriminated output to improve the signal-to-threshold ratio, with the threshold being the lowest value of noise established or obtained from within the analyzer system.

Among the discriminators discussed in prior art literature which might be useful in obtaining FM noise measurements at UHF or lower microwave frequencies is the transmission line discriminator. An article entitled "Stability Measurement Techniques in the Frequency Domain" by R. A. Campbell, IEEE-NASA Symposium on Short Term Frequency Stability, NASA SP-80, Nov. 23–24, 1964, pages 231–235, discloses such discriminators. Various aspects of detection equipment and calibration are disclosed. Also an article entitled "Single Hybrid Tee Frequency Discriminator" is disclosed by J. Nigrin et al in the IEEE Transactions on Microwave Theory and Techniques, Volumn MTT-23, No. 9, September 1975, pages 776–778. The discriminator is tuned by a movable short and has properties comparable to those of a phase discriminator.

Additional prior art includes U.S. Pat. No. 3,675,124 entitled "Apparatus for Measuring Frequency Modulation Noise Signals and for Calibrating Same" by J. R. Ashley et al. This apparatus employs an auxiliary injection phaselocked oscillator driven by a test oscillator and relies on a discriminator cavity resonator which must be accurately tuned to the exact operating frequency for proper operation. Ashley et al discusses in column 6 the difficulty of making signal measurements where limited power outputs make the use of prior art methods ineffective.

SUMMARY OF THE INVENTION

The optimum threshold transmission line discriminator relates to making measurements of near carrier FM noise in the UHF or lower microwave frequency regions. An optimum length of transmission line within the discriminator in conjunction with a slide screw turner provides the discrimination function. The tuner allows maximum efficiency in carrier nulling over the relatively broad frequency range of the optimum line in lieu of the highly restricted frequency range of a high Q tunable cavity.

The optimized transmission line discriminator provides optimum sensitivity and an improved threshold because of the specifically determined mined length of the transmission line element. Resonant cavities, which become excessively large and prohibitive at the lower frequencies of interest; and lumped element resonant circuits, which are excessively lossy at UHF are not required. The sensitivity and signal-to-threshold ratio are maximized with a circulator. Any need for a local oscillator is eliminated, thereby eliminating the prior art requirements for a separate determination of the FM noise of the local oscillator. The threshold of signal measurement is directly determined when data is taken and can be readily used as a correction factor.

DESCRIPTION OF THE PREFERRED EMBODIMENT

Figure 1:
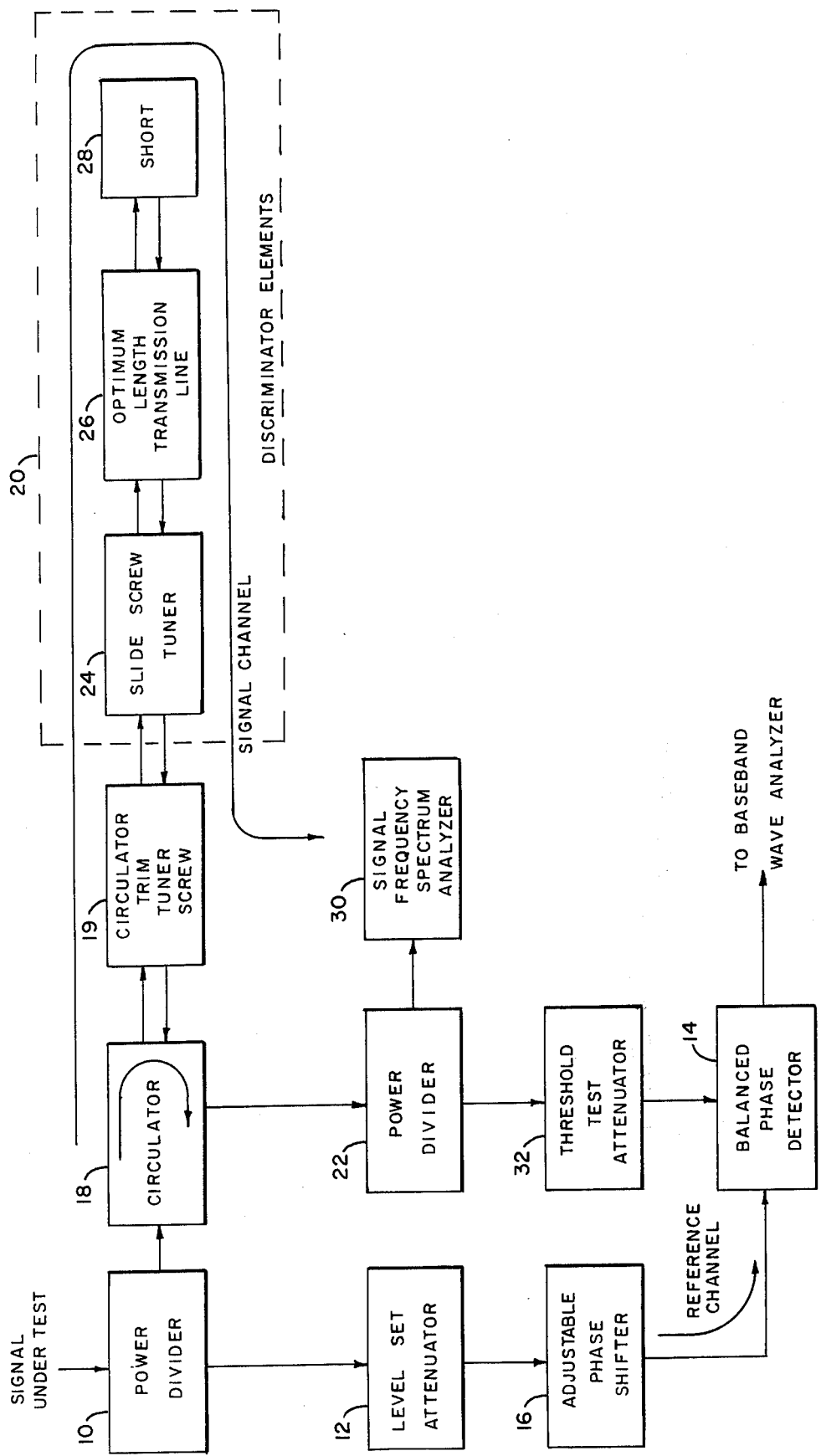
FIG. 1 is a block diagram of a preferred embodiment of the optimum threshold transmission line discriminator.

Referring now to the drawings wherein like numbers represent like parts FIG. 1 discloses a preferred embodiment of the invention. A signal whose near carrier FM sidebands are to be measured is applied as an input to power divider 10. This power divider can be any one of several different elements such as a directional coupler or 3 db power splitter. The basic function performed is that of dividing the incoming signal into two paths — the signal channel and the reference channel.

In the reference channel the coupled signal is applied to an attenuator 12 which serves as a means for adjusting the signal power applied therethrough to a balanced phase detector 14. The output of level set attenuator 12 is coupled to a phase shifter 16 and the output of the phase shifter is coupled to phase detector 14. This interconnection provides a means of both amplitude and phase adjustment of the reference channel with respect to the signal channel at the balance phase detector 14. After the appropriate signal amplitude is set by attenuator 12, phase shifter 16 is used to set up quadrature detection in the balanced phase detector, after the signal channel input has been properly adjusted. Quadrature adjustment prior to actual measurement is accomplished during calibration by supplying a known external signal input with known FM sideband levels as is well established in the art.

The signal channel output from power divider 10 is applied to a circulator 18. The function of circulator 18 is to direct the incoming signal to a discriminator element 20 without allowing this power to couple into a power divider 22. Ideally no power is cross coupled to divider 22, but with practical hardware, there is always some coupling and this goal can only be approximated. To improve the decoupling operation of circulator 18, a tuning screw 19 can be coupled at one port of the circulator. The output of tuner 19 is then coupled through a slide screw tuner 24 into an optimum length of transmission line 26 which is terminated in a short circuit 28.

The signal power from power divider 10 is now coupled through circulator 18 to slide screw tuner 24. The carrier nulling of discriminator elements 20 is accomplished by adjusting the position of the probe element of slide screw tuner 24 along the propagation path and at the same time adjusting the depth of the probe insertion transverse to the propagation path, the operation of slide screw tuners being well established in the art. The signal power proceeds from slide screw tuner 24 into optimum length line 26. The signal is coupled to a short circuit 28, which causes the signal energy to be reflected back through the optimum line and tuner. In this manner, double usage is achieved from the transmission line by using both directions of transmission. The result is that the amount of transmission line needed for optimum operation is one half the length of transmission line required if only one-directional signal flow is utilized.

The combination of slide screw tuner 24, transmission line 26 and short circuit 28 provide replacement for high Q discriminator cavities. Proper setting of slide screw tuner 24 provides extremely effective carrier nulling which, when coupled with the transmission line in optimized form, results in a cavity replacement device capable of operating over very wide frequency ranges. One section of transmission line can be used through more than four octaves of frequency range. The signal power reflected from the combination of slide screw tuner 24, transmission line 26 and short 28 is coupled through circulator 18 into power divider 22. Power divider 22, similar to power divider 10, splits the energy of the signal channel, with a spectrum analyzer 30 coupled to one output and a threshold test attenuator 32 coupled to another output.

Spectrum analyzer 30 allows a delicate set of adjustments to be accomplished with relative ease and a high degree of accuracy. Spectrum analyzer 30 allows a true minimization of feed-through power cancellation to be attained during adjustment of circulator 18. Power nulling in excess of 60 decibels can easily be attained and measured. When slide screw turner 24 is adjusted, proper tuner settings can be attained by monitoring sideband balance on analyzer 30. This particular capability is necessary to accurately carrier null the dicriminator. Accurate nulling not only requires a null on the carrier, but also requires equal amplitude balance on the sideband pair which can be readily obtained using analyer 30. With the nulling capability provided by spectrum analyzer 30, circulator 18 provides increased sensitivity of at least six db over prior art devices such as the conventional magic tee hybrid divider. The carrier nulling procedure makes this discriminator relatively immune to incidental AM on the signal being tested.

The nulled signal from circulator 18 coupled through power divider 22 travels through attenuator 32 to the balanced phase detector 14. Attenuator 32 is used to determine analyzer threshold prior to actual input signal measurement. During actual signal analysis, attenuator 32 is set for minimum attenuation.

Balanced phase detector 14 operates as a quadrature detector when phase shifter 16 is properly adjusted and the nulling operation is properly completed. Under these conditions, the output of balanced phase detector 14 is a frequency discriminated and translated set of sidebands that have been moved from the carrier frequency to baseband frequencies for analysis. The carrier nulling procedure results in a low power signal channel input to the phase detector 14. By appropriate adjustment of the attenuator 12 in the reference channel, higher power signals can be applied at the input of power divider 10. This procedure results in a larger signal to threshold ratio for the measurement. The phase detector 14 output is coupled to output circuitry (not shown) such as a wave analyzer, where it is analyzed using the established amplification, bandpass filtering, and recording devices to extract baseband data. Typical baseband analyzer equipment may comprise a low noise amplifier, a video-spectrum analyzer with selectable bandwidths, and an x-y plotter.

The optimum threshold transmission line discriminator circuit as well as other known near carrier mensuration systems operate on only one carrier frequency at a time. This is established when it is known that only one input signal exists or it can easily be forced by using bandpass filtering on the input signal (not shown).

Figure 2:
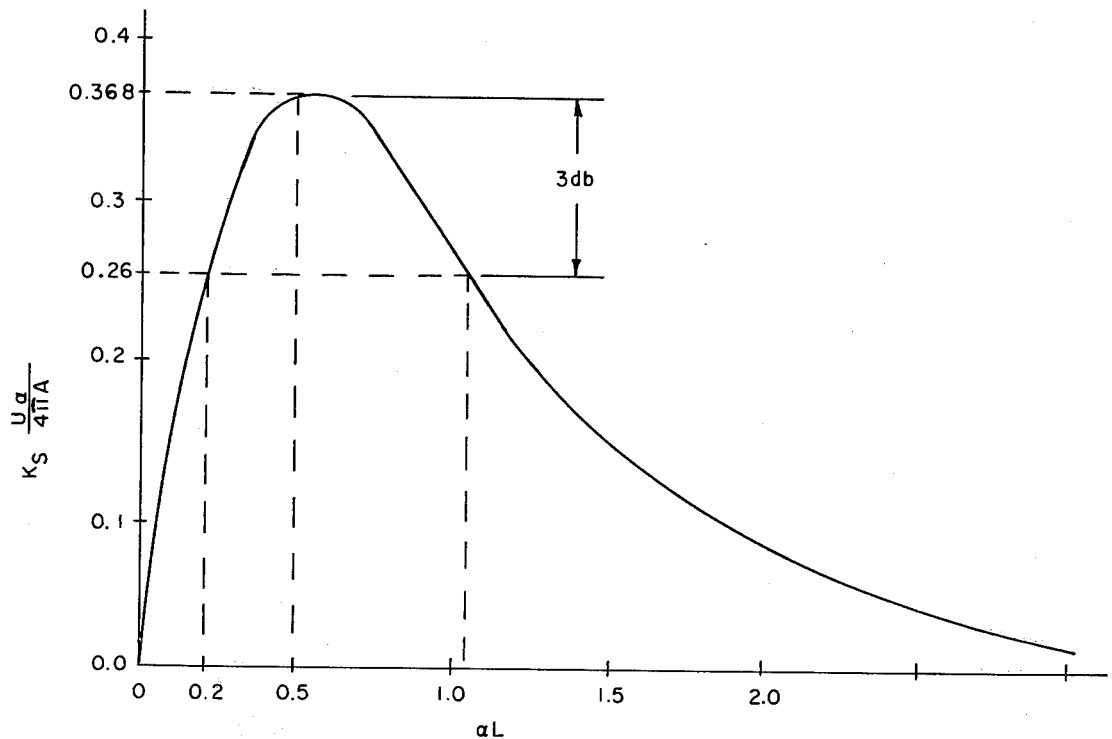
FIG. 2 is a graph of the transmission line normalized sensitivity versus line length.

The optimum length transmission line sensitivity characteristics are shown in FIG. 2. The optimum length of the line occurs when $\alpha L = 0.5$ and gives maximum sensitivity to the measurement apparatus. The peak of the line length curve is not sharp but rather is broad. Since the attenuation $\alpha$ varies slowly, being approximately proportional to the square root of frequency, this characteristic allows near optimum operation to be obtained over a considerable frequency range without appreciable degradation in the analyzer operation. An output signal within 3 db of optimum is obtained over at least a four octave frequency range. The optimum length transmission line is always determined at a particular design frequency. For the design frequency the optimum length line is always the electrical length of line at which total attenuation is one neper (8.68 decibels). As shown in FIG. 2, this length occurs for the particular embodiment after the signal has traversed the line and been reflected back through the line. Since the signal must traverse the optimum line twice in the preferred embodiment, the optimum length is indicated at 0.5 nepers on the chart. For the same given frequency and signal traversal of the line only one time, optimum length would occur at 1.0 nepers and the peak would be located over 1.0 in the Figure. The transmission line length is L, attenuation per unit length of line is $\alpha$, line transmission velocity is U, A is the amplitude in volts of the signal applied to the transmission line, and $K_s = \Delta v/\Delta f$ is the discriminator sensitivity in volts ($\Delta v$) per Hertz deviation ($\Delta f$).

Utilizing 3 db sensitivity degradation as the controlling factor for the optimum line length allows an operating frequency range within 0.4 to 2.1 nepers of total attenuation, corresponding to a $(2.1/0.4)^2 = 27.6$ frequency range, to be satisfactorily obtained. Because of the broad bandwidth of utilization before sensitivity deterioration, a single optimum length line used in the discriminator allows a broad range of frequency measurements to either side of optimum frequency before noticeable loss of sensitivity affects operation of the circuit. Obviously several selected optimum length transmission lines, such as coaxial cable, can be utilized to provide a family of optimum length lines with overlapping attenuation curves to cover a very broad range of measurement.

It is common knowledge amoung those skilled in the art to calibrate similar systems using known FM sideband levels. There are basically two techniques used in the calibration operation. Either a direct carrier nulling operation is used or an indirect sideband level magnitude is used. The direct technique involves FM modulating a source with sufficient drive power to reach a condition wherein the carrier vanishes. Adding attenuation in the modulation signal source then allows a known sideband level to be established. Typically 40 db below the carrier at 18,600 Hertz is a widely used reference. This method is very useful on devices such as Klystrons which can easily be modulated by inserting the modulating source into the repeller circuit. However, it is useless when the source is a highly stable crystal oscillator.

The indirect technique can be done either by substitution of a second source for the signal source or by separating the source from the near carrier analyzer and inserting a sideband modulating circuit between these two units to establish calibrated sidebands on the source. In the carrier substitution method a second source which can be easily modulated is substituted for the signal source to be measured. The carrier level of the substitute source is accurately matched in frequency and amplitude to the signal source to be measured. The substitute source then provides the sideband at known levels to accomplish the calibration. After calibration, the signal to be measured is reconnected to the calibrated analyzer and the measurement is made using the calibration set up by the substitute source.

The second indirect calibration method utilizing the modulating circuit inserted between the source to be measured and the analyzer uses a small portion of the source signal power as a base upon which sidebands are generated. These sidebands are then calibrated on a spectrum analyzer and properly phase shifted to be reinserted on the source signal as FM sidebands. All of these methods are commonly used to calibrate near carrier analyzer equipment and the particular technique used is often determined by the particular apparatus and circumstances involved.

Calibration of the optimum threshold transmission line discriminator involves setting phase shifter 16 for an optimum baseband power readout with the appropriate power level in the reference channel and a properly nulled signal channel input both applied simultaneously to balance phase detector 14. This calibration requires application of a known frequency modulted sideband to carrier ratio at input power divider 10. The spectrum analyzer 30 is used to determine proper sideband levels on the calibration input signal. The balanced phase detector 14 output into the baseband analysis equipment (not shown) is also used in the calibration process. The video bandpass filter of the baseband wave analyzer is set for the modulation offset frequency which is supplied at a known level by the calibration signal mentioned above. The phase detection process is then optimized by adjusting phase shifter 16 for a maximum output signal level at the output of the bandpass filter in the baseband analyzer equipment. Completion of the calibration requires that the readout device in the baseband analysis equipment be used to record the maximized output of the bandpass filter. This calibrates the entire system.

In determining the system noise threshold, a threshold measurement is made with sufficient attenuation inserted by attenuator 32 to adequately reduce the signal channel level to a point wherein the quantity being measured is not the input signal under analysis but rather the internal noise within the mensuration apparatus. This internal system noise is termed threshold noise. This identifies the internal noise and in effect separates it from the signal during threshold measurement. Attenuation is then removed from the signal path. After calibration, a near carrier FM measurement is made by applying the signal to be analyzed to power divider 10. It is important that the calibration signal previously analyzed and the signal to be analyzed have the same carrier amplitude, otherwise the calibration will not be valid. The near carrier FM sideband data is measured and recorded by the baseband equipment using the desired filter bandwidth and covering the desired frequency ranges.

Figure 3:
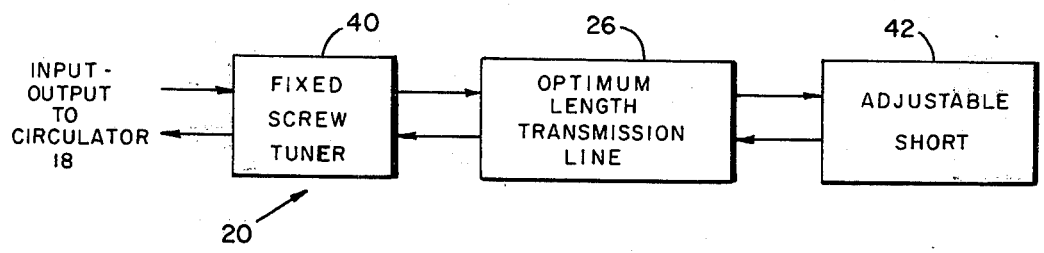
FIG. 3 is a block diagram of an alternative embodiment of the preferred embodiment of FIG. 1.

FIG. 3 of the drawing discloses an alternative embodiment for the discriminator element of FIG. 1. As shown in FIG. 3, discriminator element 20 comprises a fixed screw tuner 40, input-output stage which couples to circulator 18. The tuner 40 is coupled to optimum length line 26 and the line 26 is further coupled to an adjustable short 42. The screw would still be inserted in the same manner during nulling. The movable short replaces the function of sliding the screw along the transmission line. Eliminating the slide screw tuner 24 does have the advantage of reducing stray emission from the open waveguide slot in the tuner. This enhances measurement at very high power transmission levels by reducing stray radiation. Nulling is optimized by adjusting the position of the movable short cooperatively with the amount of screw insertion into the waveguide to acquire correct null. Calibration and operation of the discriminator is otherwise identical to that of the preferred embodiment.

The discriminator allows threshold noise within the discriminator circuit to be identified and thereby used to correct the measured data. The spectrum analyzer 30 in conjunction with the tunable discriminator element allows a null to be obtained for the particular signal under test. Because of the broad band characteristics of line 26, as shown in FIG. 2, signal frequencies adjacent to the optimum frequency of line 26 can be measured with acceptable loss or degradation in sensitivity. This eliminates the tedious problems associated with having to replace microwave cavities for relatively small changes in signal frequency and also provides an excellent discriminator at lower frequencies where cavities are impractical.

A related discriminator apparatus is disclosed in a copending application Ser. No. 652,446 entitled "Wide Operating Frequency Range Transmission Line Discriminator" by G. J. Rast, Jr., T. A. Barley, and J. R.

Ashley; and in a copending application Ser. No. 652,445 entitled "Optimum Length Transmission Line Discriminator with Low Noise Detector" by T. A. Barley, G. J. Rast, Jr., and J. R. Ashley. These copending applications were filed Jan. 26, 1976, simultaneously with applicants' application, and are assigned to the U.S. Government as represented by the Department of the Army.

Obviously modification and variation of the present invention is possible in light of the above disclosure. It is, therefore, to be understood that within the scope of the appended claims, the invention may be practiced otherwise than as specifically disclosed herein.

We claim:

1. An optimum threshold transmission line discriminator circuit for measuring characteristics and frequency modulation noise on input signals comprising:

first and second power divider means, each having an input and first and second outputs, the input of said first power divider being disposed to receive said modulation noise signals;

signal circulator means having first, second, and third ports, said first port being coupled to the first output of said first power divider, said second port being coupled to the input of said second power divider;

a phase dectector having first and second inputs and an output, said first input being coupled to the first output of said second power divider and said second input being coupled to the second output of said first power divider, the output of said detector being disposed for coupling output measurement signals therefrom;

a spectrum analyzer coupled to the second output of said second power divider; and discriminator means having an input-output port coupled to the third port of said second circulator.

2. An optimum threshold transmission line discriminator circuit as set forth in claim 1 wherein said discriminator means comprises a series coupled tuner, an optimum length transmission line, and a shorted terminal, said tuner being coupled to said cirulator; and further comprising a tuning screw coupled between said slide screw tuner and said circulator for trimming said circulator.

3. An optimum threshold transmission line discriminator circuit as set forth in claim 2 wherein said tuner is a slide screw tuner and further comprising a phase shifter coupled between the second output of said first power divider and the second input of said phase detector.

4. An optimum threshold transmission line discriminator as set forth in claim 3 and further comprising a first attenuator coupled between the second output of said first power divider and said phase shifter; and a second attenuator coupled between first output of said second power divider and the first input of said phase detector.

5. An optimum threshold transmission line discriminator as set forth in claim 2 and further comprising a level set attenuator and an adjustable phase shifter connected in series between the second output of said first power divider and the second input of said phase detector; and a threshold attenuator coupled between the first output of said second power divider and the first input of said phase detector.

6. An optimum threshold transmission line discriminator as set forth in claim 5 wherein said tuner is a fixed screw tuner and the shorted terminal is an adjustable short.

7. An optimum threshold transmission line discriminator as set forth in claim 5 wherein said tuner is a slide screw tuner.

8. An optimum threshold transmission line discriminator as set forth in claim 2 wherein said optimum length transmission line is a coaxial line having a precise length which provides ½ neper of attenuation across the electrical length of the line for a predetermined frequency.

9. An optimum threshold transmission line discriminator as set forth in claim 8 and further comprising a first attenuator coupled between the second output of said first power divider and said phase shifter; a second attenuator coupled between the first output of said second power divider and the first input of said phase detector; a phase shifter coupled between the second output of said first power divider and the second input of said phase detector; and wherein said tuner is a slide screw tuner.

10. An optimum threshold transmission line discriminator as set forth in claim 8 and further comprising a level set attenuator and a adjustable phase shifter connected in series between the second output of said first power divider and the second input of said phase detector; a threshold attenuator coupled between the first output of said second power divider and the first input of said phase detector; and wherein said tuner is a fixed screw tuner and said shorted terminal is an adjustable short.

* * * * *